(12) United States Patent
Li et al.

(10) Patent No.: US 11,855,074 B2
(45) Date of Patent: Dec. 26, 2023

(54) ELECTROSTATIC DISCHARGE DEVICES

(71) Applicant: GLOBALFOUNDRIES U.S. Inc., Santa Clara, CA (US)

(72) Inventors: Zhiqing Li, Halfmoon, NY (US); William J. Taylor, Jr., Clifton Park, NY (US); Anindya Nath, Essex Junction, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 258 days.

(21) Appl. No.: 17/170,325

(22) Filed: Feb. 8, 2021

(65) Prior Publication Data
US 2022/0254773 A1 Aug. 11, 2022

(51) Int. Cl.
*H01L 27/02* (2006.01)

(52) U.S. Cl.
CPC ................... *H01L 27/0262* (2013.01)

(58) Field of Classification Search
CPC .................. H01L 27/0262; H01L 27/0259
See application file for complete search history.

(56) References Cited

U.S. PATENT DOCUMENTS

| | | | | |
|---|---|---|---|---|
| 6,566,715 B1* | 5/2003 | Ker | ........ | H01L 27/0251 257/361 |
| 6,987,301 B1* | 1/2006 | Zhang | ........ | H01L 27/0259 257/362 |
| 7,244,992 B2 | 7/2007 | Ker et al. | | |
| 7,714,356 B2 | 5/2010 | Abou-Khalil et al. | | |
| 9,318,479 B2* | 4/2016 | Li | ........ | H01L 27/0259 |
| 2002/0003236 A1* | 1/2002 | Czech | ........ | H01L 27/0259 257/173 |
| 2008/0203424 A1* | 8/2008 | Chen | ........ | H01L 27/0255 257/E33.001 |
| 2010/0067155 A1 | 3/2010 | Gallerano et al. | | |
| 2013/0328162 A1* | 12/2013 | Hu | ........ | H01L 27/0635 257/E29.174 |
| 2014/0124894 A1* | 5/2014 | Hellings | ........ | H01L 29/0688 438/328 |
| 2014/0367829 A1* | 12/2014 | Lee | ........ | H01L 29/732 257/557 |
| 2015/0076557 A1* | 3/2015 | Salcedo | ........ | H01L 27/0262 257/173 |
| 2015/0236009 A1* | 8/2015 | Gill | ........ | H01L 29/0821 438/335 |
| 2016/0372458 A1* | 12/2016 | Lai | ........ | H01L 27/0292 |
| 2017/0098645 A1* | 4/2017 | Su | ........ | H01L 27/0262 |
| 2017/0125400 A1* | 5/2017 | Lee | ........ | H01L 29/866 |

(Continued)

*Primary Examiner* — Bitew A Dinke
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to electrostatic discharge devices and methods of manufacture. The structure includes: a plurality of regions of a first dopant type; insulator material separating each region of the plurality of regions of the first dopant type; and a substrate contacting the plurality of regions of the first dopant type, the substrate comprising a base region of a second dopant type different than the first dopant type and an outer segment surrounding the plurality of regions of the first dopant type, the outer segment comprises an electrical resistivity higher than the second dopant type.

19 Claims, 6 Drawing Sheets

(56) References Cited

U.S. PATENT DOCUMENTS

| | | | |
|---|---|---|---|
| 2018/0040602 A1* | 2/2018 | Lee | H01L 29/785 |
| 2018/0082994 A1* | 3/2018 | Han | H01L 27/0274 |
| 2018/0226394 A1* | 8/2018 | Lee | H01L 29/0649 |
| 2018/0277633 A1* | 9/2018 | Yoshioka | H01L 29/0619 |
| 2018/0323185 A1* | 11/2018 | Lee | H01L 29/0649 |
| 2020/0135715 A1* | 4/2020 | Loiseau | H01L 21/76224 |
| 2020/0303367 A1* | 9/2020 | Chan | H02H 9/046 |
| 2022/0208751 A1* | 6/2022 | Chang | H01L 27/0255 |
| 2022/0285336 A1* | 9/2022 | Chiang | H01L 29/0692 |

* cited by examiner

ELECTROSTATIC DISCHARGE DEVICES

FIELD OF THE INVENTION

The present disclosure relates to semiconductor structures and, more particularly, to electrostatic discharge devices and methods of manufacture.

BACKGROUND

Electrostatic discharge (ESD) is the sudden flow of electricity between two electrically charged objects caused by an electrical short or dielectric breakdown. Electronic components, e.g., integrated circuits and microchips, can be damaged by ESD events. For example, integrated circuits can suffer permanent damage when subjected to high voltages associated with ESD events. Accordingly, sensitive components need to be protected during and after manufacture, during shipping and device assembly, and in the finished device.

An electrostatic discharge (ESD) device protects a circuit from an ESD event in order to prevent a malfunction or breakdown of the electronic device. However, existing ESD devices show non-uniform triggering in a multi-finger ESD device, weak ESD protection robustness, and inefficient use of silicon area. To compensate for these shortcomings, a tunable trigger voltage can be provided for a multi-finger ESD device.

SUMMARY

In an aspect of the disclosure, a structure comprises: a plurality of regions of a first dopant type; insulator material separating each region of the plurality of regions of the first dopant type; and a substrate contacting the plurality of regions of the first dopant type, the substrate comprising a base region of a second dopant type different than the first dopant type and an outer segment surrounding the plurality of regions of the first dopant type, the outer segment comprises an electrical resistivity higher than the second dopant type.

In an aspect of the disclosure, a structure comprising: at least one fin structure comprising a substrate material; a plurality of fingers comprising a first dopant type extending over the at least one fin structure; a common base comprising a second dopant type contacting the plurality of fingers from an underside; and a ring structure within the common base and surrounding the plurality of fingers, the ring structure comprising material having an electrical resistivity higher than the second dopant type.

In an aspect of the disclosure, a method comprises: forming a plurality of regions of a first dopant type; forming insulator material separating each region of the plurality of regions of the first dopant type; and forming a substrate contacting the plurality of regions of the first dopant type, the substrate comprising a base region of a second dopant type different than the first dopant type and an outer segment surrounding the plurality of regions of the first dopant type, the outer segment comprises an electrical resistivity higher than the second dopant type.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to electrostatic discharge (ESD) devices and methods of manufacture. More specifically, the present disclosure relates to multi-finger ESD devices in FinFET technologies. Alternatively, the ESD devices can be implemented in planar technologies. In either scenario, the ESD devices include a high substrate resistivity band to improve current uniformity throughout the array of ESD devices. Accordingly and advantageously, the high substrate resistivity band provides uniform triggering in multi-finger FinFET or planar ESD devices with a $R_{on}$ reduction compared to conventional ESD devices.

In embodiments, the ESD devices include a high substrate resistivity band in a guard-ring surrounding an array of devices. This high resistivity band can be created by modifying a well mask layer layout or by increasing a depth of a shallow trench isolation structure, amongst other structures. Properly tuned, the higher resistivity region (e.g., high resistivity band) results in a uniform current profile throughout the array (center-to-edge), preventing hot-spots and thus allowing for better ESD performance. And, compared to conventional ESD devices, the footprint of the ESD devices using the high resistivity band can be reduced by minimizing or even omitting silicide block regions.

The ESD devices of the present disclosure can be manufactured in a number of ways using a number of different tools. In general, though, the methodologies and tools are used to form structures with dimensions in the micrometer and nanometer scale. The methodologies, i.e., technologies, employed to manufacture the ESD devices of the present disclosure have been adopted from integrated circuit (IC) technology. For example, the structures are built on wafers and are realized in films of material patterned by photolithographic processes on the top of a wafer. In particular, the fabrication of the ESD devices uses three basic building blocks: (i) deposition of thin films of material on a substrate, (ii) applying a patterned mask on top of the films by photolithographic imaging, and (iii) etching the films selectively to the mask.

Figure 1A:
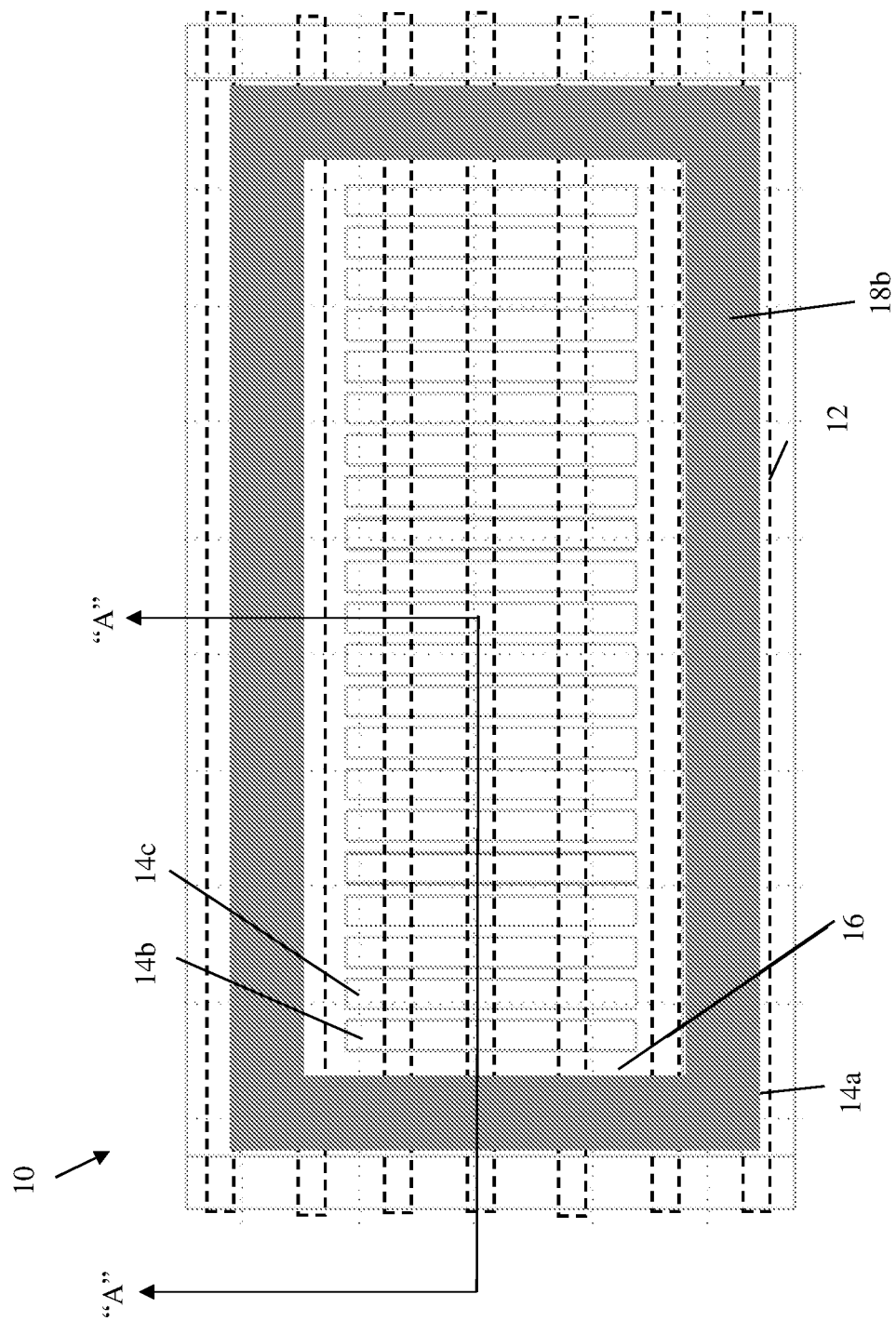
FIG. 1A shows a top view of an array of ESD devices and respective fabrication processes in accordance with aspects of the present disclosure.
Figure 1B:
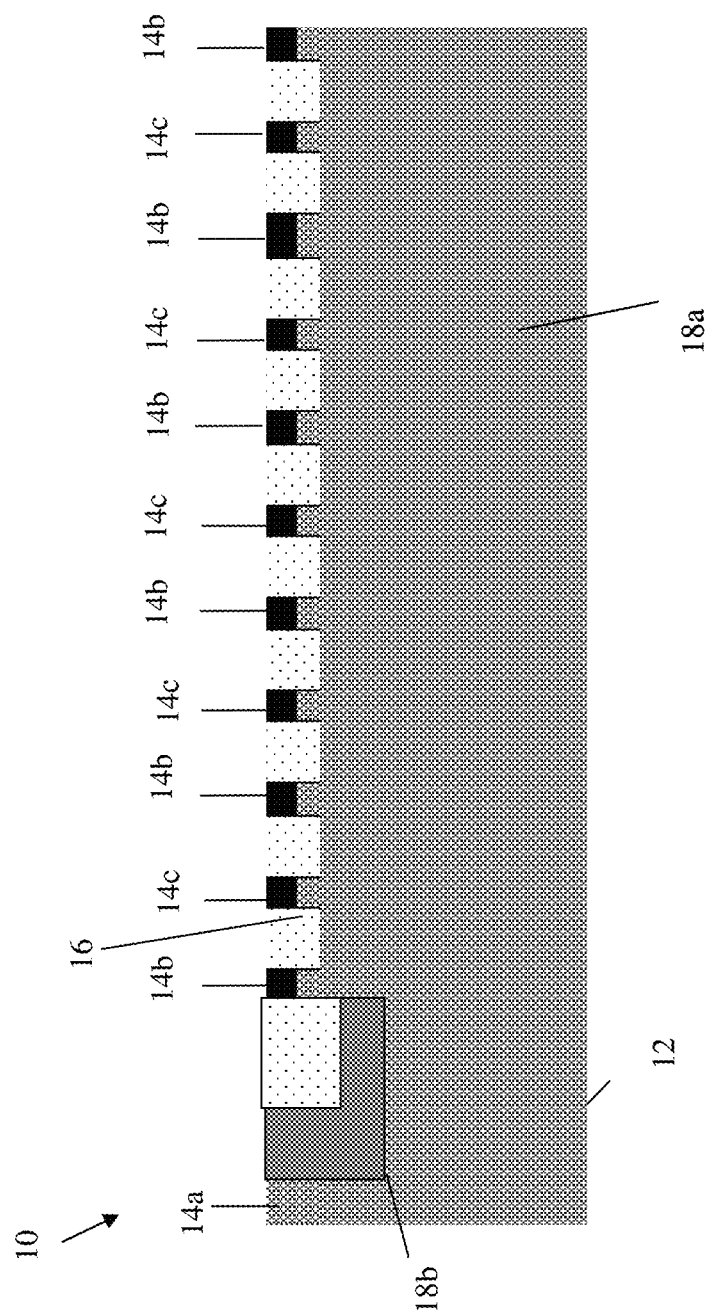
FIG. 1B shows a cross-sectional view of the array of ESD devices of FIG. 1, along line "A"-"A".

FIG. 1A shows a top view of an array of ESD devices and respective fabrication processes in accordance with aspects of the present disclosure. FIG. 1B shows a cross-sectional view of the ESD devices of FIG. 1A, along line "A"-"A". Referring to both FIGS. 1A and 1B, the array of ESD devices 10 can be representative of an array of multi-finger NPN devices or multi-finger PNP devices using FinFET technologies. Alternatively, in FIGS. 1A and 1B, the ESD device 10 can be an array of NMOS devices or PMOS devices, in either a FinFET configuration or planar configuration. For example, the NMOS or PMOS devices are representatively shown in the cross-sectional view of FIG. 1B.

In embodiments, the ESD devices are formed on a substrate 12 composed of any suitable semiconductor material including, but not limited to, Si, SiGe, SiGeC, SiC, GaAs, InAs, InP, and other III/V or II/VI compound semiconductors. The substrate 12 can be bulk silicon or, alternatively, can be composed of semiconductor-on-insulator material (SOI). As described in more detail below, in either the bulk silicon configuration or SOI configuration, the substrate 12 can include a P-well for the NPN configuration or a N-well for the PNP configuration. Similarly, in a MOSFET implementation, the substrate 12 can include a P-well for a NMOS configuration or a N-well for a PMOS configuration.

In embodiments, the SOI structure can include the substrate 12 on an insulator layer, with the insulator layer on top of a bulk wafer. The insulator layer comprises any suitable material, including silicon oxide, sapphire, other suitable insulating materials, and/or combinations thereof. An exemplary insulator layer may be a buried oxide layer (BOX). The insulator layer can be formed by any suitable process, such as separation by implantation of oxygen (SIMOX), oxidation, deposition, and/or other suitable process. The substrate 12 on top of the insulator layer can be fabricated using wafer bonding and/or other suitable methods.

In the FinFET configuration, the substrate 12 can be representative of one or more fin structures as shown representatively in FIGS. 1A and 1B. The fin structures can be fabricated by conventional CMOS fabrication processes including sidewall image transfer (SIT) techniques. In the SIT technique, for example, a mandrel material, e.g., $SiO_2$, can be formed on the substrate 12 (or cap layer over the substrate) using conventional deposition processes. A resist can be formed on the mandrel material, and exposed to light to form a pattern (openings). A reactive ion etching can be performed through the openings to form the mandrels. In embodiments, the mandrels can have different widths and/or spacing depending on the desired dimensions between the fin structures. Spacers are formed on the sidewalls of the mandrels which are preferably material that is different than the mandrels, and which can be formed using conventional deposition processes known to those of skill in the art. The spacers can have a width which matches the dimensions of the fin structures, for example. The mandrels are removed or stripped using a conventional etching process, selective to the mandrel material. An etching can then be performed within the spacing of the spacers to form the sub-lithographic features of the fin structures. The sidewall spacers can then be stripped.

Still referring to FIGS. 1A and 1B, the ESD devices include multiple regions 14a, 14b, 14c. In a NPN configuration, the multiple regions 14a, 14b, 14c include a P+ base 14a which surrounds and is in contact with multiple N+ finger regions 14b, 14c, i.e., N+ emitter regions 14b alternating with N+ collector regions 14c. As should be understood by those of skill in the art, a single ESD device comprises a N+ emitter region 14b, an adjacent N+ collector region 14c and the common base region 14a.

In embodiments, the base region 14a includes two different dopant profiles represented by regions 18a, 18b. For example, in the NPN configuration, the P+ doping profile of region 18b can have a lower doping concentration than the P+ doping profile of region 18a (e.g., remaining common base region 14a with makes contact to the regions 14b, 14c).

Alternatively, the doping profile of region 18b can be a different dopant type, e.g., n-type dopant, compared to the dopant type, e.g., p-type dopant, for region 18a. In either embodiment, the doping profile of region 18b forms a high resistivity band, i.e., higher electrical resistivity, surrounding the multiple N+ finger regions 14b, 14c (e.g., transistor arrays). In a MOSFET implementation, the multiple regions 14b, 14c can be representative of N+ source and drain regions.

Alternatively, in a PNP configuration, the multiple regions 14a, 14b, 14c include a N+ base region 14a which surrounds and contacts with multiple P+ finger regions, i.e., P+ emitter regions 14b alternating with P+ collector regions 14c. Similar to the previous configuration, the base region 14a includes regions 18a, 18b comprising different dopant profiles. As in the previous example, the doping profile of region 18b can have a lower doping concentration or different dopant type than region 18a resulting in a higher resistivity, i.e., higher electrical resistivity, surrounding the multiple P+ finger regions 14b, 14c. In any of the embodiments, the doping profile of region 18b ("L-shaped outer segment" (as shown from a cross sectional view)) can extend underneath a shallow trench isolation structure 16, but should not contact region 14b. In a MOSFET implementation, the multiple regions 14b, 14c can be representative of P+ source and drain regions.

The regions 14a, 14b, 14c can be fabricated with conventional CMOS processes including, e.g., ion implantation processes. For example, P+ regions can be doped with p-type dopants, e.g., Boron (B), and N+ regions can be doped with n-type dopants, e.g., Arsenic (As), Phosphorus (P) and Sb, among other suitable examples. A more detailed discussion of the doping processes, e.g., ion implantation, for regions 18a, 18b will be discussed with respect to FIG. 2.

The regions 14a, 14b, 14c can be separated by shallow trench isolation structures 16 extending into the substrate 12. In embodiments, the shallow trench isolation structures 16 can have a depth of approximately 250 nm extending into the substrate 12; although other depths are also contemplated herein. The shallow trench isolation structures 16 can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), can be used to form one or more trenches in the substrate 12 through the openings of the resist. Following the resist removal by a conventional oxygen ashing process or other known stripants, insulator material (e.g., $SiO_2$) can be deposited in the one or more trenches by any conventional deposition processes, e.g., chemical vapor deposition (CVD) processes. Any residual material on the surface of the substrate 12 can be removed by conventional chemical mechanical polishing (CMP) processes.

Figure 2:
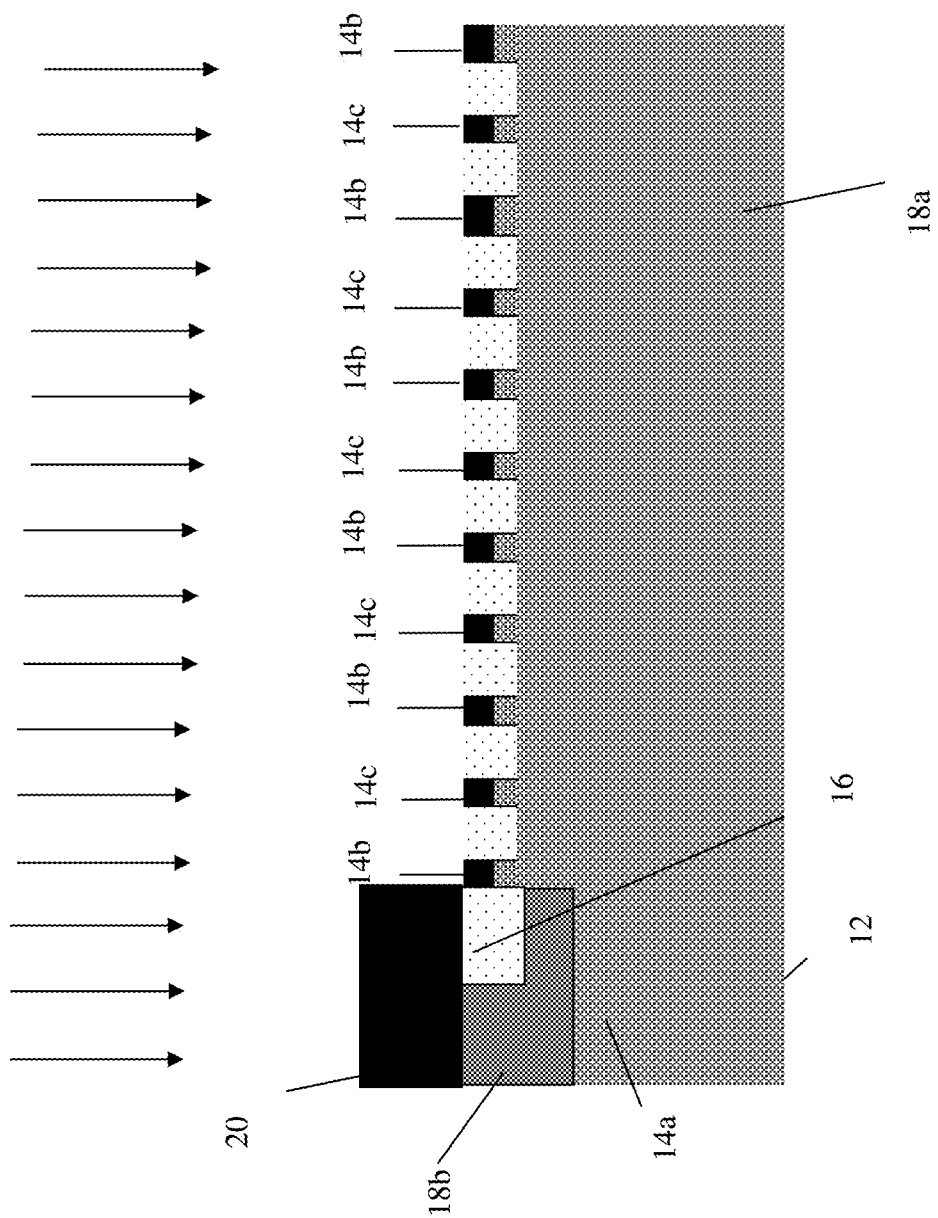
FIG. 2 representatively shows the fabrication processes for different dopant profiles of a base region in accordance with aspects of the present disclosure.

FIG. 2 representatively shows the fabrication processes for creating the dopant profiles in regions 18a, 18b of the base region 14a. By way of illustrative example, an implantation mask 20 can be formed (patterned) over the region 18b during the ion implantation process of region 18a. The implantation mask 20 has a thickness and stopping power sufficient to block the masked area against receiving a dose of the implanted ions. For example, the implantation mask 20 may include a layer of a light-sensitive material, such as an organic photoresist, applied by a spin coating process, pre-baked, exposed to light projected through a photomask, baked after exposure, and developed with a chemical developer. The implantation mask can be stripped after implantation.

With the implantation mask 20 over region 18b, the substrate 12 can be subjected to an ion implantation process. In the case of a NPN configuration, p-type dopants would be used for the ion implantation process, e.g., dose of the implanted ions; whereas, for a PNP configuration, n-type dopants would be used for the ion implantation process. As noted already herein, p-type dopants can be, e.g., Boron (B), and n-type dopants can be, e.g., Arsenic (As), Phosphorus (P) and Sb, among other suitable examples By having the implantation mask 20 over region 18b, the dopant profile of region 18b results in a lower dopant concentration (e.g., dopant profile) than the dopant concentration of region 18a. For example, in a NPN device, the P+ dopant concentration of region 18b can be, e.g., 1E17, compared to the dopant concentration for region 18a, e.g., 1E18; although other dopant concentrations are contemplated herein, for example, in the range of 1E17 to 1E19. And, as should be understood by those of skill in the art, the lower dopant concentration provides a higher resistivity region (e.g., high substrate resistivity band) which, when properly tuned, results in a uniform current profile throughout the array of ESD devices (center-to-edge), preventing hot-spots and thus allowing for better ESD performance.

In the case in which the regions 18a, 18b have different dopant types, the implantation mask 20 would be removed and another implantation mask would be formed over region 18a during the ion implantation process with an opposite dopant type, e.g., n-type dopant in the region 18b for the NPN configuration. The implantation mask over the region 18a would then be removed after the ion implantation process. And, similar to the lower dopant concentration, a different dopant type provides a higher resistivity region (e.g., high substrate resistivity band) which, when properly tuned, also results in a uniform current profile throughout the array of ESD devices (center-to-edge), preventing hot-spots and thus allowing for better ESD performance.

The regions 14a, 14b, 14c can undergo a silicide process to form silicide contacts, followed by forming metallization features, e.g., conductive contacts. The silicide contacts and conductive contacts are represented by the lines extending to regions 14a, 14b, 14c. As should be understood by those of skill in the art, the silicide process begins with deposition of a thin transition metal layer, e.g., nickel, cobalt or titanium, over fully formed and patterned semiconductor devices (e.g., doped or ion implanted regions 14a, 14b, 14c). After deposition of the material, the structure is heated allowing the transition metal to react with exposed silicon (or other semiconductor material as described herein) in the active regions of the semiconductor device forming a low-resistivity transition metal silicide. Following the reaction, any remaining transition metal is removed by chemical etching, leaving silicide contacts in the active regions of the device.

The conductive contacts can be formed in contact with the silicide contacts using conventional lithography, etching and deposition processes within an interlevel dielectric material as is known in the art such that no further explanation is required herein for a complete understanding of the present disclosure.

Figure 3:
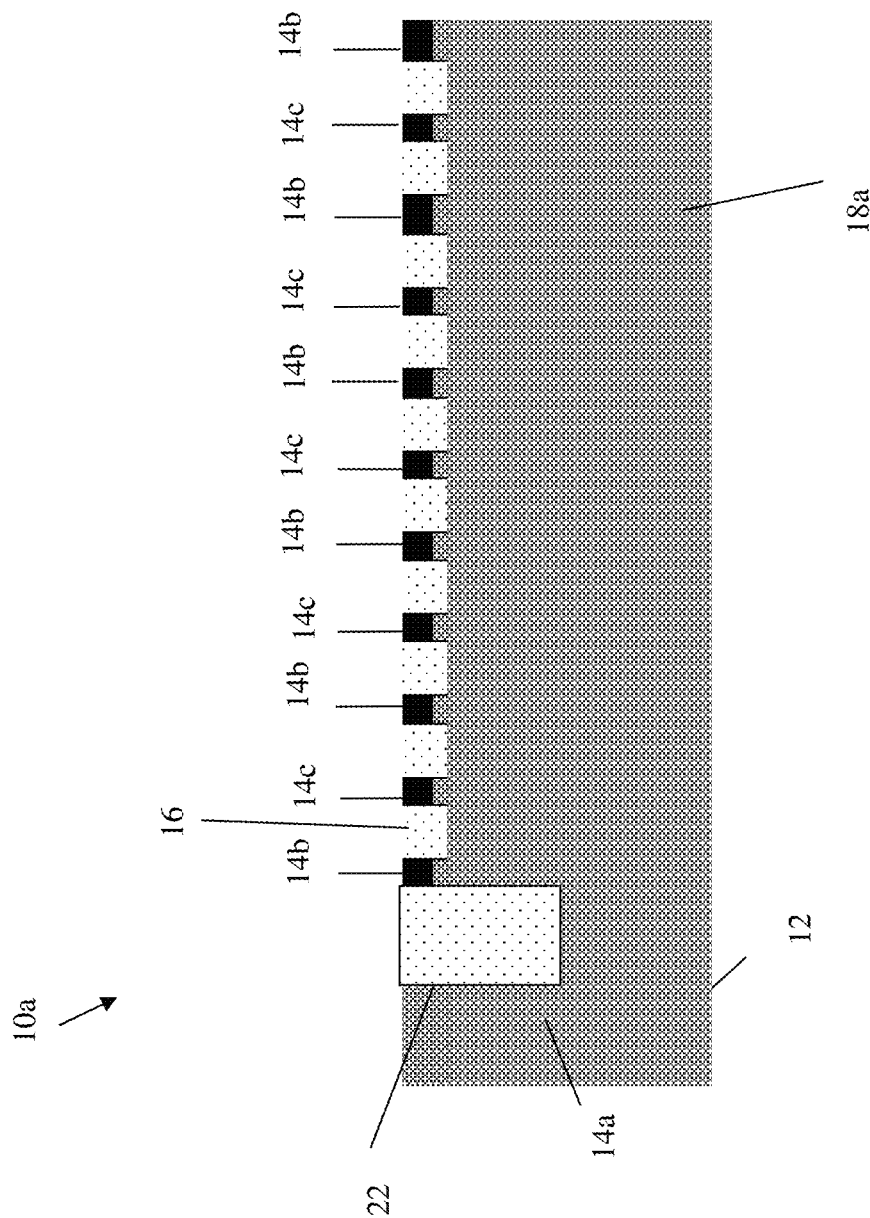
FIG. 3 shows a cross-sectional view of an array of ESD devices and respective fabrication processes in accordance with additional aspects of the present disclosure.

FIG. 3 shows a cross-sectional view of an array of ESD devices and respective fabrication processes. In the structure 10a, a deep trench structure 22 is provided in the base region 14a, surrounding the array of devices, e.g., regions 14b, 14c. In embodiments, the deep trench structure 22 can be a deep trench isolation structure formed using conventional lithography, etching and deposition processes as already described herein with respect to the shallow trench isolation structures 16. The deep trench structure 22 can be filled with any insulator material such as, e.g., $SiO_2$, SiN or other non-conducting material that increases the parasitic resistivity of the base region surrounding regions 14b, 14c. In alternative embodiments, the deep trench structure 22 can be filled with any material that provides a higher resistivity than the substrate material 12, e.g., region 18a. For example, the deep trench structure 22 can be filled with other material in which the electrical conductive capacity is reduced.

Still referring to FIG. 3, the deep trench structure 22 should have a depth that is deeper than the remaining shallow trench isolation structures 16. In further embodiments, the depth of the deep trench structures 22 should preferably be less than a depth of the region 18b, e.g., doped well, in order to maintain an electrical pathway.

Figure 4:
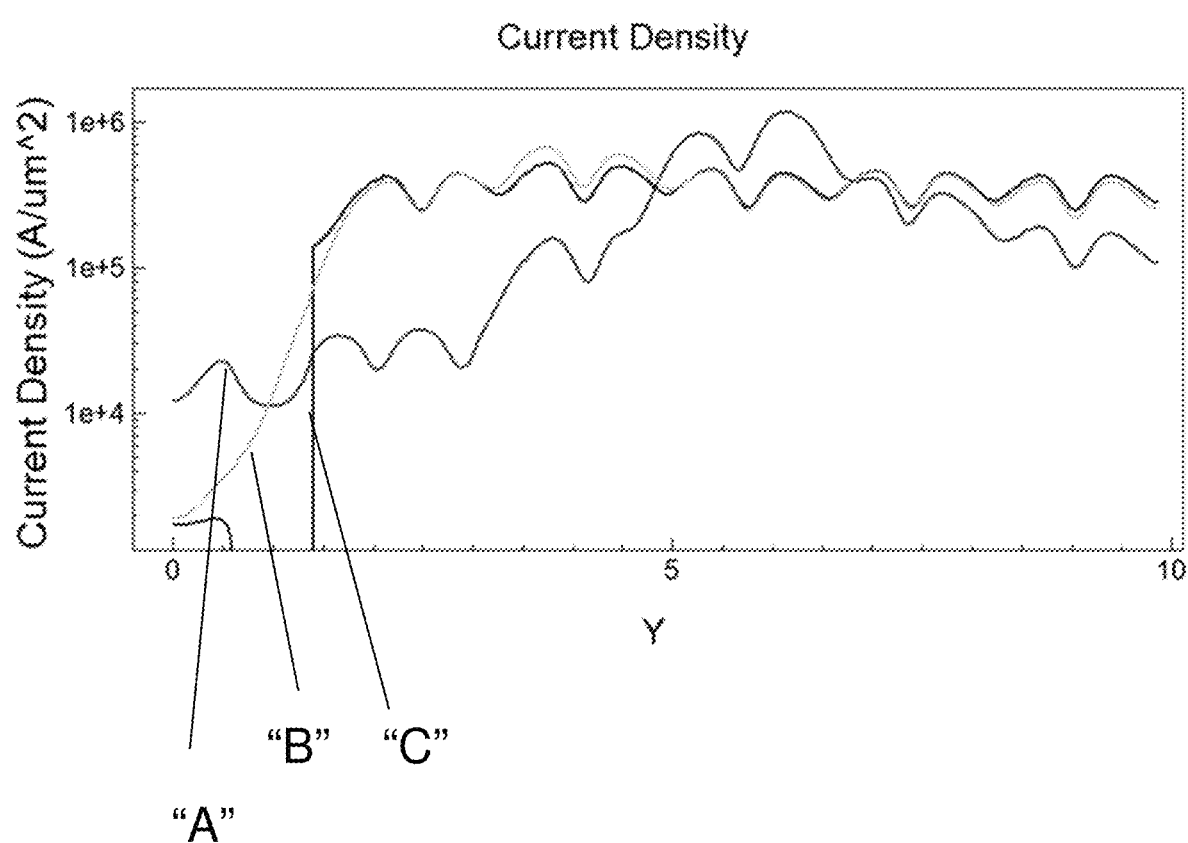
FIG. 4 is a comparison graph showing current density of the ESD devices shown in FIGS. 1A-3, compared to a conventional ESD structure.

FIG. 4 is a comparison graph showing current density of the ESD devices shown in FIGS. 1A-3. More specifically, the graph of FIG. 4 shows improvement in current density of the ESD devices shown in FIGS. 1A-3, resulting in a uniformity of triggering of the ESD devices 10, 10a. In FIG. 4, the "x" axis is representative of location of the ESD devices from an edge (e.g., region 18b or deep trench structure 22) of the structure; whereas, the "y" axis represents current density. Line "A" represents a conventional structure which includes a uniform dopant profile, line "B" is represents an ESD structure which includes a non-uniform dopant profile (e.g., structure 10 of FIGS. 1A-1B), and line "C" represents an ESD structure which includes a deep trench structure (e.g., structure 22 of FIG. 3).

As shown in FIG. 4, the structures 10, 10a represented by lines "B", "C" have a significantly more uniform current density distribution along the length Y of the devices, in comparison to the conventional structure shown in line "A". By having a more uniform current density distribution, all the junctions in the array can be easily turned on with substrate current, e.g., all of the devices in the array (e.g., center-to-edge) can be turned on in an ESD event. Accordingly, the ESD protection robustness is significantly improved using the structures 10, 10a shown in FIGS. 1A-3. This is in comparison to a conventional NPN (or PNP) type structure in which the P-well (or N-well) of the base region has a uniform doping profile, which, when biased for use, results in an undesirable potential gradient and current density gradient, center-to-edge, in the transistor array.

Figure 5:
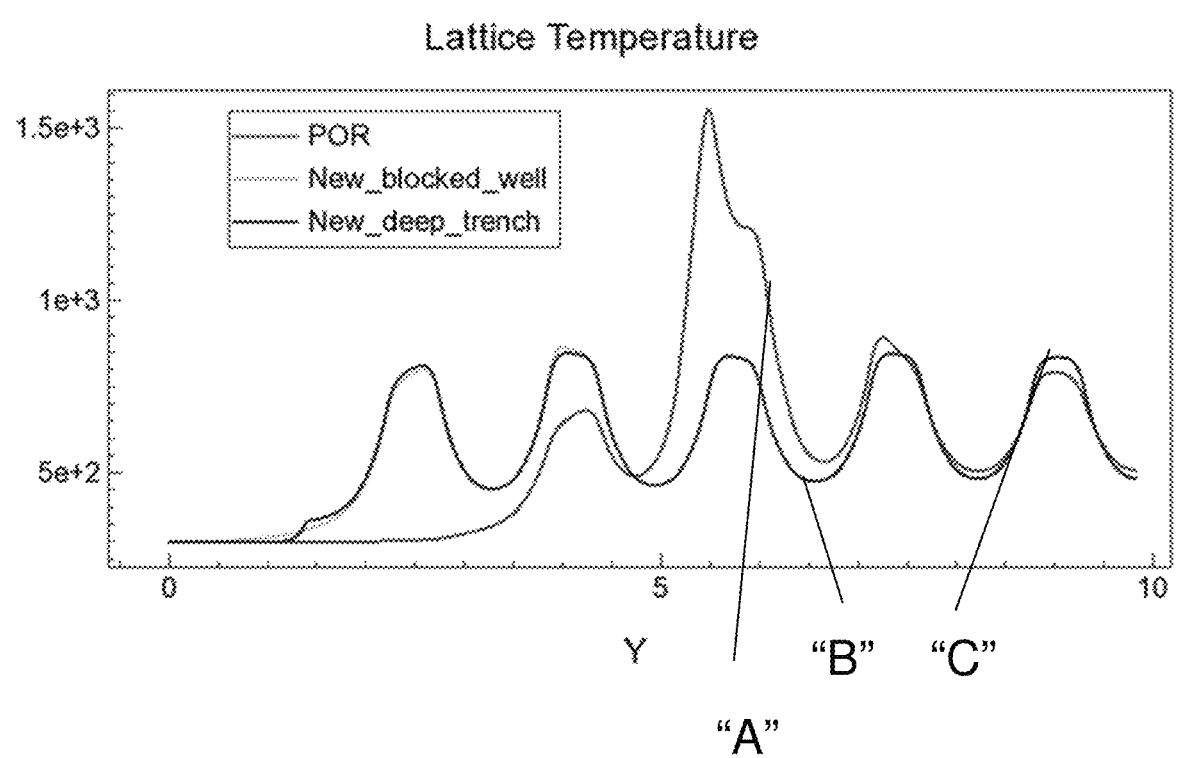
FIG. 5 is a comparison graph showing lattice temperature of the ESD devices shown in FIGS. 1A-3, compared to a conventional ESD structure

FIG. 5 is a comparison graph showing lattice temperature of the ESD devices shown in FIGS. 1A-3, compared to a conventional ESD structure. In FIG. 5, the "x" axis is representative of location of the ESD devices from region 18a or deep trench structure 22; whereas, the "y" axis is representative of lattice temperature in Kelvin. Line "A" represents a conventional structure which includes a uniform dopant profile, line "B" represents an ESD structure which includes a non-uniform dopant profile (e.g., structure 10 of FIGS. 1A-1B), and line "C" represents an ESD structure which includes deep trench structure (e.g., structure 10a of FIG. 3).

As shown in FIG. 5, the Tmax of structures 10, 10a is reduced by about 500° C. As current and temperature have a known relationship, FIG. 5 shows that the structures 10, 10a have a uniform current density gradient, center-to-edge, in the array, compared to the conventional structure shown by line "A". Accordingly, the graph of FIG. 5 also shows a more uniform current density distribution and, hence, a significantly improved robustness to ESD protection.

The ESD devices can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a plurality of regions of a first dopant type;
    insulator material separating each region of the plurality of regions of the first dopant type;
    a substrate contacting the plurality of regions of the first dopant type, the substrate comprising a base region of a second dopant type different than the first dopant type and an L-shaped outer segment surrounding the plurality of regions of the first dopant type, the L-shaped outer segment comprises an electrical resistivity higher than other portions of the base region; and
    a shallow trench isolation structure confined between both legs of the L-shaped outer segment and an outer one of the plurality of regions of the first dopant type.

2. The structure of claim 1, wherein the first dopant type comprises n-type dopant and the second dopant type comprises p-type dopant.

3. The structure of claim 1, wherein the L-shaped outer segment surrounding the plurality of regions comprises a lower concentration of the second dopant type than the base region.

4. The structure of claim 1, wherein the L-shaped outer segment surrounding the plurality of regions comprises the first dopant type.

5. The structure of claim 1, wherein the L-shaped outer segment surrounding the plurality of regions comprises a material having an electrical resistivity higher than the than the other portions of the base region.

6. The structure of claim 1, wherein the plurality of regions of the first dopant type comprises alternating emitter regions and collector regions, and the base region comprises a common base region contacting each of the alternating emitter regions and collector regions from an underside.

7. The structure of claim 6, wherein a combination of each alternating emitter region, collector region and the common base region comprises an electrostatic discharge (ESD) device.

8. The structure of claim 1, wherein the first dopant type comprises p-type dopant, the second dopant type comprises n-type dopant, and the L-shaped outer segment surrounding the plurality of regions comprises one of a lower concentration of the first dopant type than the base region, the first dopant type, and a material having a higher electrical resistivity than the base region.

9. The structure of claim 1, wherein the plurality of regions of the first dopant type comprise a plurality of fingers extending over a plurality of fin structure comprising the substrate.

10. The structure of claim 1, wherein the L-shaped outer segment extends into only the base region of the second dopant type which has a uniform concentration.

11. A structure comprising:
    at least one fin structure comprising a substrate material;
    a plurality of fingers comprising a first dopant type extending over the at least one fin structure;
    a common base comprising a second dopant type contacting the plurality of fingers from an underside; and
    a ring structure within the common base and surrounding the plurality of fingers, the ring structure comprising material having an electrical resistivity higher than the common base,
    wherein the ring structure comprises a dopant type with an L-shaped cross-section which has the electrical resistivity higher than the common base and further comprises a shallow trench isolation structure within the doped outer segment comprising the electrical resistivity higher than the common base.

12. The structure of claim 11, wherein the ring structure comprises a lower concentration of the second dopant type than remaining portions of the common base.

13. The structure of claim 11, wherein the ring structure surrounding the plurality of fingers comprises the first dopant type.

14. The structure of claim 11, wherein the ring structure comprises a deep trench isolation structure.

15. The structure of claim 14, wherein the deep trench isolation structure comprises a depth greater than a depth of insulator material that separates each of the plurality of fingers.

16. The structure of claim 11, wherein the plurality of fingers comprises alternating emitter regions and collector regions, and the common base contacts each of the alternating emitter regions and collector regions, with a combination of each emitter region, collector region and the common base comprising an electrostatic discharge (ESD) device.

17. The structure of claim 11, wherein the shallow trench isolation structure is bounded by both legs of the L-shaped cross-section of the ring structure and an outer finger of the plurality of fingers.

18. The structure of claim 11, wherein the common second dopant type of the common base comprises a uniform concentration.

19. A method comprising:
forming a plurality of regions of a first dopant type;
forming insulator material separating each region of the plurality of regions of the first dopant type; and
forming a region of a second dopant type different than the first dopant type, the region comprising an L-shaped outer segment surrounding the plurality of regions of a first dopant type and which comprises an electrical resistivity higher than other portions of the base region; and
a shallow trench isolation structure confined between both legs of the L-shaped outer segment and an outer one of the plurality of regions of the first dopant type.

\* \* \* \* \*